United States Patent [19]
Kim

[11] Patent Number: 5,960,278
[45] Date of Patent: Sep. 28, 1999

[54] METHOD OF MANUFACTURING SRAM CELL

[75] Inventor: Jae-Kap Kim, Ichon, Rep. of Korea

[73] Assignee: Hyundai Electronics Industries Co., Ltd., Kyoungki-do, Rep. of Korea

[21] Appl. No.: 08/825,583

[22] Filed: Mar. 27, 1997

[30] Foreign Application Priority Data

Mar. 28, 1996 [KR] Rep. of Korea ................. 96-8943

[51] Int. Cl.$^6$ ............................................. H01L 21/8244
[52] U.S. Cl. ............................................. 438/238; 438/241
[58] Field of Search .......................... 438/238, 241

[56] References Cited

U.S. PATENT DOCUMENTS

| | | | |
|---|---|---|---|
| 4,499,652 | 2/1985 | Shrivastava | 29/571 |
| 5,047,818 | 9/1991 | Tsukamoto | 357/23.6 |
| 5,324,973 | 6/1994 | Sivan | 257/330 |
| 5,354,704 | 10/1994 | Yang et al. | |
| 5,396,098 | 3/1995 | Kim et al. | 257/344 |
| 5,741,735 | 4/1998 | Violette et al. | 438/279 |

*Primary Examiner*—Jey Tsai
*Attorney, Agent, or Firm*—Ware, Fressola, Van Der Sluys & Adolphson LLP

[57] ABSTRACT

The present invention introduces an SRAM cell which enhances immunity to soft errors and a manufacturing method thereof. A method of manufacturing an SRAM cell having access devices, pull-up devices and pull-down devices and forming a cell node junction in common junction regions of the pull-down devices and the access devices, the manufacturing method including the steps of: providing a semiconductor substrate of which active regions are difined and gate insulating layers and gates are formed on thereof; forming $N^-$ junction regions in the substrates of both sides of the gates for the pull-down devices region and the access devices region, wherein the $N^-$ junction regions formed in the cell node are separated therein and are adjacent to the gates thereof; forming the insulating layer spacers on both side-walls of the gates; and forming $N^+$ junction regions in the substrate of both side of the spacers for the pull-down devices region and the access devices region.

6 Claims, 3 Drawing Sheets

METHOD OF MANUFACTURING SRAM CELL

BACKGROUND OF THE INVENTION

1. Field of the Invention

The present invention relates to a semiconductor memory device and method of manufacturing the same, and more particularly, to a Static Random Access Memory cell which enhances immunity to soft errors and a manufacturing method thereof.

2. Description of the Related Art

A semiconductor memory device is classified into a Dynamic Random Access Memory (DRAM) and a Static Random Access Memory (SRAM) according to its method of storing data. The SRAM is particularly significant due to its high speed, low power consumption, and simple operation. In addition, unlike the DRAM, the SRAM has advantages of an easy design as well as not having to regularly refresh stored data.

The SRAM cell generally includes: two drive transistors which are pull-down devices; two access devices; and two pull-up devices. The SRAM is further categorized into three structures: a full CMOS cell; an High Road Resistor (HRL) cell; and a Thin Film Transistor (TFT) cell, according to the type of a pull-up devices used.

The full CMOS cell utilizes a P-channel bulk MOSFET as the pull-up device. The HRL cell utilizes a polysilicon having a high resistance value as the pull-up device, and the TFT cell utilizes a P-channel polysilicon TFT as the pull-up device. Of the above mentioned structures, the SRAM cell with the full CMOS cell structure has a optimal operational device properties and can be fabricated with a relatively simple process. It, however, includes a NMOS and PMOS transistor, resulting in a large cell size. Therefore, it is usually applied to the memory device having a small capacitance, such semiconductor logic devices. On the other hand, the SRAM cell with the HRL cell and the TFT cell structure have relatively poor performance and is complicated in their fabrication. An SRAM cell, however, using the above structures, has the advantage of small cell size and is therefore generally applied to a semiconductor memory devices with larger capacitance.

FIG. 1 is a conventional circuit diagram of an SRAM cell with full CMOS cell structure.

As shown in this diagram, sources S1 and S2 of PMOS transistors Q1 and Q2 for use in pull-up devices are connected to VDD. Drains D1 and D2 of the PMOS transistors Q1 and Q2 are respectively connected in series to each drains D3 and D4 of NMOS transistors Q3 and Q4 for use in pull-down devices at nodes N1 and N2. Sources S1 and S1 of the NMOS transistors Q3 and Q4 are connected to VSS. Gates G1 and G2 of the PMOS transistors Q1 and Q2 are respectively connected to gates G3 and G4 of the NMOS transistors Q3 and Q4, and these connection points thereof are respectively cross-coupled with the nodes N1, N2. In NMOS transistors Q5 and Q6 for use in access devices, Gates G5 and G6 are connected to a word line W/L, sources S5 and S6 are respectively connected to bit lines B/L1 and B/L2. Drains D5 and D6 of NMOS transistors Q5 and Q6 are respectively connected to the drains D3 and D4 of the NMOS transistors Q3 and Q4 at the nodes N1, N2.

In the above described SRAM cell, the NMOS transistors Q5 and Q6 are turned on by turning on the word line W/L, to store data in a HIGH state in the node N1 and data in a LOW state in the node N2. Data in a HIGH state is inputted to the bit line B/L1 and data in a LOW state is inputted to the bit line B/L2, so that the PMOS transistor Q1 and NMOS transistor Q4 are turned on, and PMOS transistor Q2 and NMOS transistor Q3 are turned off. Therefore, the node N1 becomes a HIGH state and the node N2 becomes a LOW state. Furthermore, although the word line W/L is turned off, the node N2 is latched to maintain a LOW state and the node N1 is maintained at a HIGH state. Accordingly, data is stored in the nodes N1 and N2 respectively.

One of the most important factors affecting the performance of the SRAM is an immunity to soft errors. The immunity to the soft errors is determined by a current($I_{ON}$) of the pull-up devices in an on state and cell node capacitance. In case a voltage in a high state VDD of the node N1 is Vh, the current ($I_{ON}$) of the pull-up devices and the cell node capacitance influence the an immunity to soft errors as follows.

If the bit line B/L1 is VDD, the NMOS transistor Q5 is turned on. Therefore the Vh is reduced by a threshold voltage (Vt) of the NMOS transistor Q5 thereby decreasing to VDD-Vt. At this time, if amount of current is provided from power supply of the VDD is sufficient, the Vh is increased back to the VDD. Thus, when the Vh is decreased from VDD to VDD-Vt by the turning on of the NMOS transistor Q5, in case of a large cell node capacitance, a rate of decrease from Vh to the VDD-Vt is low. In case of a high $I_{ON}$ and a large cell node capacitance, a time of the increase back to the VDD is fast.

Conventionally, to prevent hot carrier effect, a source/drain junction region is formed as an LDD structure having a $N^-$ source/drain junction region and a $N^+$ source/drain junction region to thereby form a grade junction under a gate. In this case, the $N^-$ source/drain region is formed by P ions and the $N^+$ source/drain junction region is formed by As ions. A concentration profile of P ions is a moderate in nature, so that the junction capacitance is small, and a concentration profile of As ions is very abrupt in nature, so that the junction capacitance is large. Moreover, impurity concentration of the $N^+$ junction region is 10 to $10^2$ times high than that of the $N^-$ junction region, so that the junction capacitance of the former is $\sqrt{10}$ to $\sqrt{100}$ times larger than that of the latter. Because the junction capacitance is proportional to root multiple of a impurity concentration. However, the $N^-$ regions of the source/drain junction regions formed as the grade junction decrease a cell node capacitance in SRAM. Therefore the immunity against soft errors of SRAM decrease.

SUMMARY OF THE INVENTION

An object of the present invention is to provide a SRAM cell with an enhanced immunity to soft errors by an increase of cell node capacitance, and a Method of manufacturing the same.

In accordance with an embodiment, there is provided an SRAM cell including: access devices, pull-up devices and pull-down devices having respectively the junction region of an LDD structure and forming a cell node junction in common junction regions of the pull-down devices and the access devices, wherein $N^-$ junction region of the common junction region is overlapped with a predetermined portion of both sides of $N^+$ junction region.

In accordance with an embodiment, there is also provided an SRAM cell including: a semiconductor substrate; first and second gates formed on the substrate and having insulating layer spacers in their side-walls; high concentration junction regions formed respectively in the substrates under both sides of the first and second gates, wherein one of the high concentration junction regions known as common junction region, is between the first and second gates; and low concentration junction regions formed under the high concentration junction region and overlapping with the high concentration junction regions, wherein the low concentration junction regions in the common junction region are only overlapped with a predetermined portion of both the side of the high concentration junction region.

Furthermore, there is provided a method of manufacturing an SRAM cell having access devices, pull-up devices and pull-down devices, and a cell node junction in common junction regions of the pull-down devices and the access devices, the manufacturing method including the steps of: providing a semiconductor substrate of which active regions are defined and gate insulating layers and gates are formed on thereof; forming N⁻ junction regions in the substrates of both sides of the gates for the pull-down devices region and the access devices region, wherein the N⁻ junction regions formed in the cell node are separated therein and are adjacent to the gates thereof; forming the insulating layer spacers on both side-walls of the gates; and forming N⁺junction regions in the substrate of both side of the spacers for the pull-down devices region and the access devices region.

BRIEF DESCRIPTION OF THE DRAWINGS

The objects and features of the invention may be better understood with reference to the following detailed description, appended claims, and attached drawings wherein:

DETAILED DESCRIPTION OF THE INVENTION

A preferred embodiment according to the present invention is described below with reference the attached drawings.

Figure 1:
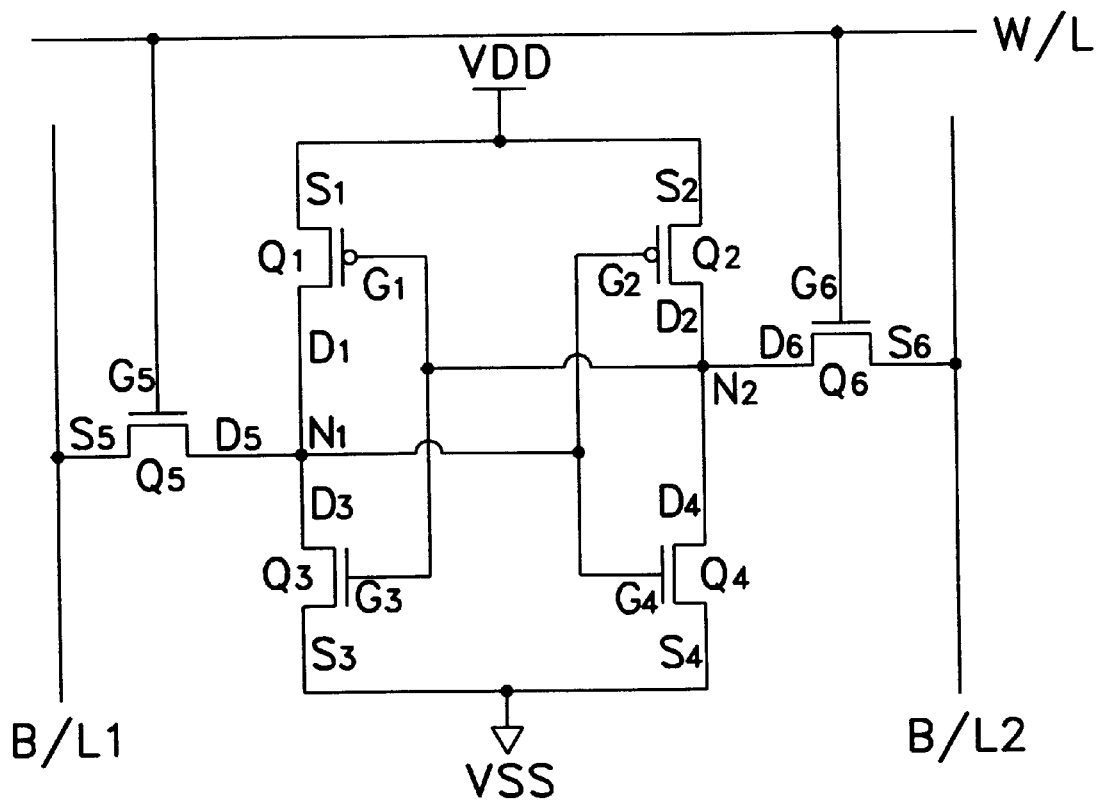
FIG. 1 is an equivalent circuit diagram of a conventional SRAM cell with a full CMOS structure.
Figure 2:
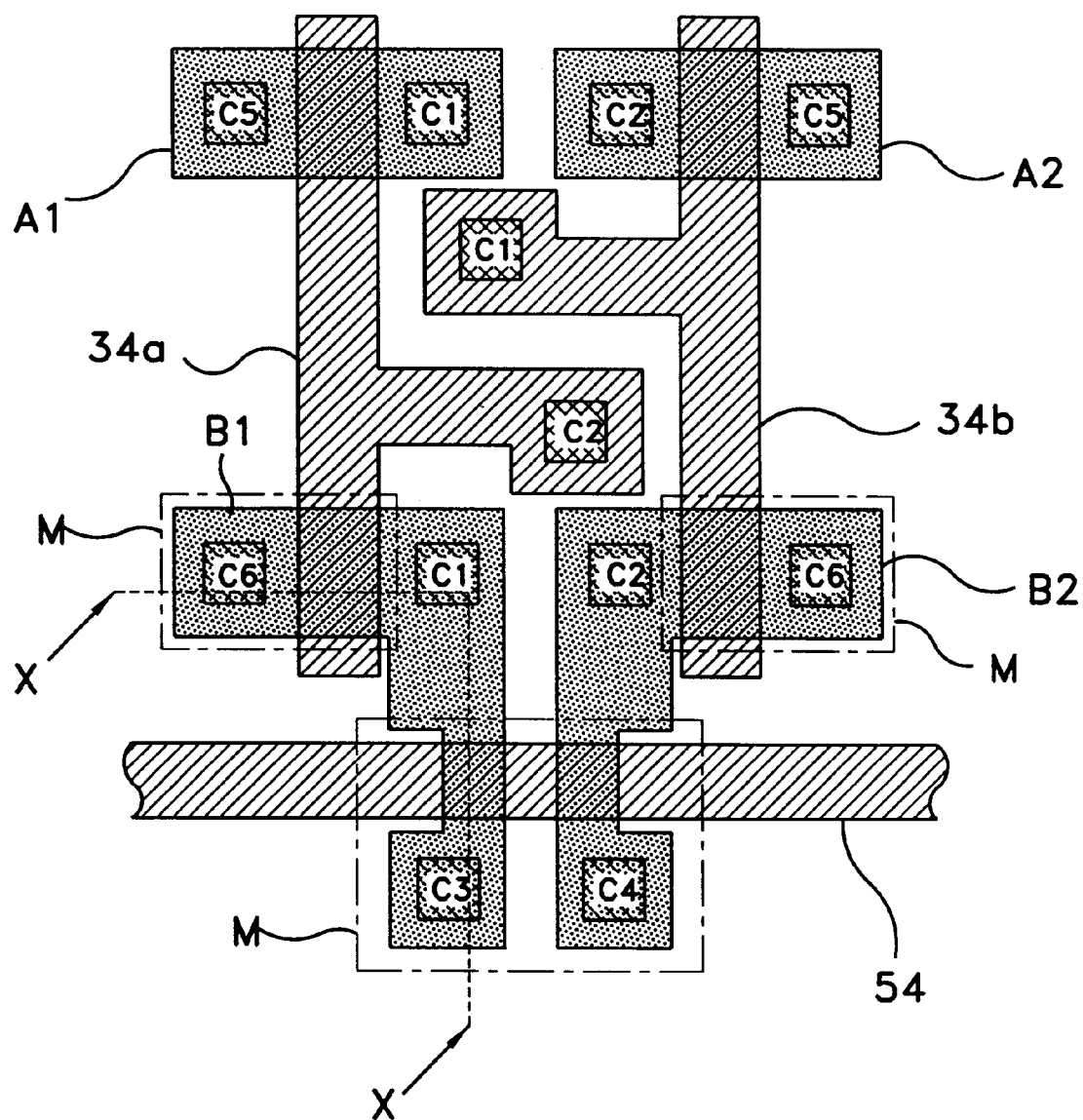
FIG. 2 is a plane view showing the SRAM cell with a full CMOS cell structure according to a preferred embodiment of the present invention.

Referring to FIG. 2 with cross reference to FIG. 1, A1 and A2 denote active regions of PMOS transistors Q1 and Q2 for use in pull-up devices, and B1 and B2 denote active regions of NMOS transistors Q3 and Q5, and Q4 and Q6 for use in pull down and access devices. C1–C6 denote contact regions. C1 and C2 denote contact regions of node N1 and N2. The NMOS transistors Q3 and Q4 for use in pull-down devices and NMOS transistors Q5 and Q6 for use in access devices have in common the node contact regions C1 and C2 with in the active regions B1 and B2 respectively. C3 and C4 denote contact regions of source S5 and S6 of NMOS transistors Q5 and Q6. C5 denotes contact regions of source S1 and S2 of PMOS transistor Q1 and Q2, and C6 denotes contact regions of source S3 and S4 of the NMOS transistors Q3 and Q4. There are also provided word lines 34a, 34b, 54 and mask pattern M used for forming a LDD region of the NMOS transistors Q3 to Q6. Here, the mask pattern M is an open pattern to expose the sources S3 to S6 of the NMOS transistor Q3 and Q4 for use in pull-down devices and the NMOS transistor Q5 and Q6 for use in access devices, and also expose a predetermined portion of the common region of the NMOS transistor Q3 and Q5, and the NMOS transistor Q4 and Q6.

Meanwhile, FIG. 2 illustrates only the pull CMOS SRAM cell structure, the above structure can be also applied to the HRL SRAM and P-channel polysilicon TFT SRAM structures.

Figure 3A:
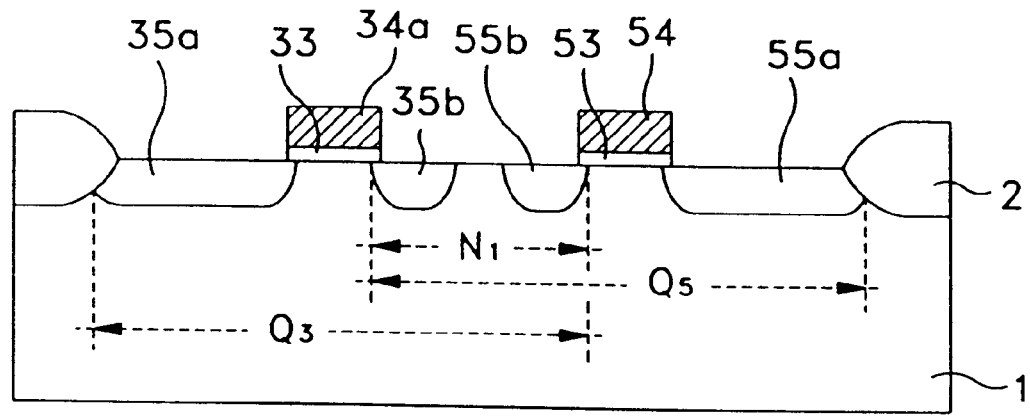
FIGS. 3A and 3B are cross sectional views showing a method for manufacturing the cell node junction regions of the SRAM cell according to a preferred embodiment of the present invention.
Figure 3B:
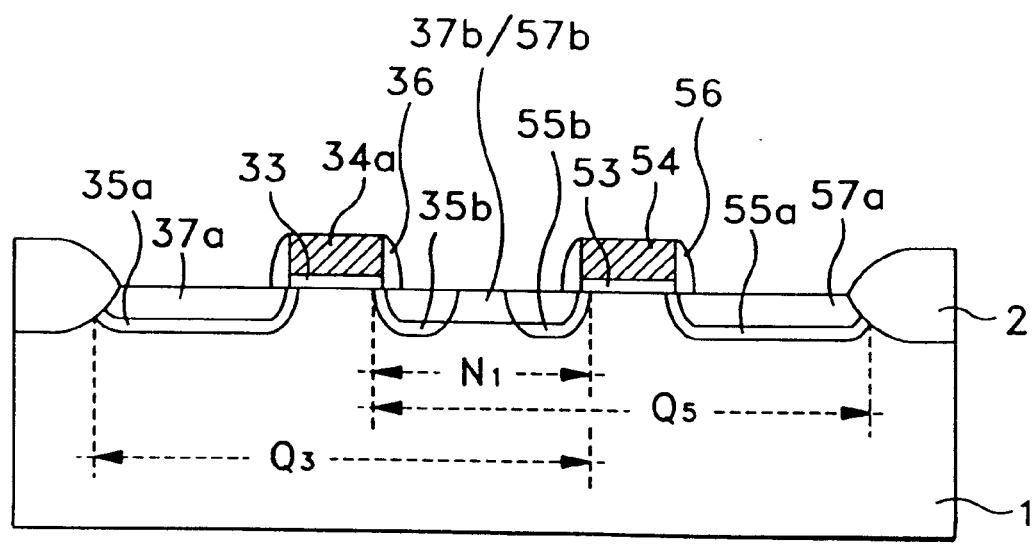

FIGS. 3A and FIG. 3B are sectional views of the NMOS transistor Q3 for use in pull down device and the NMOS transistor Q5 for use in access device of SRAM cell taken along the line X-X' of FIG. 2. With reference to FIG.3A and 3B, a manufacturing method of the above-mentioned SRAM cell is explained in detail.

As illustrated in FIG. 3A, isolating layers 2 are formed on a predetermined portion of a semiconductor substrate 1. Gate insulating layers 33 and 53 and gates 34a and 54 of NMOS transistor Q3 for use in pull-down device and NMOS transistor Q5 for use in access device, are respectively formed on the substrate between the isolating layers 2. Although not shown in FIG. 3A, the mask pattern M (refer to FIG. 2) used for forming a LDD region of the NMOS transistors Q3 to Q5, is formed on the substrate 1. The mask pattern M exposes predetermined source regions and common drain, namely cell node region N1 of the NMOS transistor Q3 for use in pull-down device and the NMOS transistor Q5 for use in access device.

Thereafter, N⁻ impurity ions, preferably P ions, are ion implanted into the substrate 1 exposed by the mask pattern M to a concentration of approximately $1\times10^{13}$ to $5\times10^{13}$ ions/cm². Therefore, N⁻ source regions 35a and 55a of the NMOS transistor Q3 for use in pull-down device and NMOS transistor Q5 for use in access device, are formed in the substrate 1. N⁻ drain regions 35b, 55b, which are separated in the cell node region N1 and are adjacent to the gates 34a and 54, are also formed. The mask pattern M is then removed.

As illustrated in FIG. 3B, an insulating layer, preferably an oxide layer or a nitride layer is deposited on the structure thus formed in FIG. 3A. Surface of the gates 34a and 54 are then etched by anisotropic blanket etching, so that LDD spacers 6 of the insulating layer are formed on both side walls of the gates 34a and 54. Thereafter N⁺ impurity ions, preferably As ions, are ion implanted to a concentration of approximately $1\times10^{15}$ to $7\times10^{15}$ ions/cm² into the substrate N1, so that N⁺ source and drain regions 37a, 37b/57b and 57a are formed. Thus, junction regions of LDD structure are completed. Therefore, the common drain region, namely the cell node region N1, of the NMOS transistor Q3 for use in pull-down and the NMOS transistor Q5 for use in access, is formed as a grade junction structure that the N⁻ drain region 35b and 55b are only overlapped with a predetermined portions at both sides of the N⁺ drain region 57a.

According to the conventional art, the cell node junction region of the SRAM cell is formed as the grade junction that the N⁻ region and the N⁺ region are entirely overlapped. Therefore the cell node capacitance of the SRAM cell is decreased by the N⁻ region. However, according to the present invention, the cell node junction region of the SRAM cell is formed as the grade junction structure that the N⁻ regions are only overlapped with a predetermined portion of both the side of the N⁺ region. Therefore, the cell node capacitance of the SRAM cell increases, thereby immunity against soft errors is enhanced.

Furthermore, a fabrication of the SRAM cell having above the cell node junction region in accordance with the invention, is processed without additional steps.

While this invention has been described with reference to illustrative embodiments. This description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as falling within the spirit and scope of the invention.

What is claimed is:

1. A method of manufacturing an SRAM cell having access devices, pull-up devices and pull-down devices, and a cell node junction in common junction regions of the pull-down devices and the access devices, the manufacturing method comprising the steps of:

providing a semiconductor substrate where active regions of the access, pull-up and pull-down devices are defined respectively and gate insulating layers and gates are formed thereon;

forming a mask pattern having openings exposing the active regions of the pull-down and access devices, wherein the openings are separated in the cell node by a selected distance:

implanting $N^-$ impurity ions into the exposed regions through the openings, to form $N^-$ junction regions in the active regions of both sides of the gates for the pull-down and access devices, wherein the $N^-$ junction regions are separated in the cell node by the selected distance;

removing the mask pattern;

forming spacers comprising an insulating layer on both side-walls of the gates; and forming $N^+$ junction regions in the active regions of both sides of the spaces for the pull-down and access devices, wherein portions of the $N^+$ function region are overlapped with the $N^-$ junction regions in the cell node.

2. The method for manufacturing an SRAM cell according to claim 1, wherein said $N^-$ junction region is formed by ion implanting P ions to a concentration of $1 \times 10^{13}$ to $5 \times 10^{13}$ ions/cm$^2$.

3. The method of manufacturing an SRAM cell according to claim 1, wherein said $N^+$ function region is formed by ion implanting As ions to a concentration of $1 \times 10^{15}$ to $7 \times 10^{15}$ ions/cm$^2$.

4. The method for manufacturing an SRAM cell according to claim 1, wherein said pull-up devices are P-channel bulk MOSFETs.

5. The method for manufacturing an SRAM cell according to claim 1, wherein said pull-up devices are resistors.

6. The method for manufacturing an SRAM cell according to claim 1, wherein said pull-up devices are P-channel polysilicon TFTs.

* * * * *

UNITED STATES PATENT AND TRADEMARK OFFICE
CERTIFICATE OF CORRECTION

PATENT NO : 5,960,278
DATED : September 28, 1999
INVENTOR(S): J. Kim

It is certified that error appears in the above-identified patent and that said Letters Patent are hereby corrected as shown below:

At col. 5, line 22, please cancel ":" after "distance" and substitute --;-- therefor.

At col. 6, line 6, please cancel "function" and substitute --junction-- therefor.

Signed and Sealed this

Twenty-seventh Day of June, 2000

Attest:

Q. TODD DICKINSON

Attesting Officer

Director of Patents and Trademarks